United States Patent
Huang et al.

[11] Patent Number: 6,153,907
[45] Date of Patent: Nov. 28, 2000

[54] IC LAYOUT STRUCTURE FOR MOSFET HAVING NARROW AND SHORT CHANNEL

[75] Inventors: Chih-Yao Huang, Hsinchu; C.-C. Cheng, Taoyuan; Huey-Jong Wu, Taichung, all of Taiwan

[73] Assignee: Mosel Vitelic Inc., Taiwan

[21] Appl. No.: 09/217,009

[22] Filed: Dec. 21, 1998

[30] Foreign Application Priority Data

Sep. 18, 1998 [TW] Taiwan ................................. 87115622

[51] Int. Cl.⁷ .......................... H01L 29/76; H01L 29/94; H01L 31/062
[52] U.S. Cl. .......................... 257/327; 257/401; 257/396; 257/29; 257/206
[58] Field of Search .................................. 257/327, 401, 257/395–396, 206, 24, 27, 29

[56] References Cited

U.S. PATENT DOCUMENTS 4,893,156  1/1990  Karasawa ................................. 257/401
5,886,380  3/1999  Nakajima ................................. 257/321

FOREIGN PATENT DOCUMENTS 8-288398  11/1996  Japan.

*Primary Examiner*—John Guay
*Attorney, Agent, or Firm*—Greer, Burns & Crain, Ltd.

[57] ABSTRACT

A specific IC layout structure for the MOSFET having a narrow and short channel, especially when the width and the length of the channel are both as small as 1 micron or less, is disclosed. In the IC layout structure, a mask includes a first mask region for defining a first active region, a second mask region for defining a second active region, and a third mask region for defining a channel region, and the third mask region is connected to the first and the second mask regions, respectively. An angle at an joint between the first mask region and the third mask region and/or an angle at an joint between the second mask region and the third mask region are/is greater than 90 degrees so that there is more space beside the channel region provided for the growth of the field oxide. Thus a 3-D oxidation thinning effect can be prevented and the properties of the MOSFET having a narrow and short channel can be stabilized.

9 Claims, 5 Drawing Sheets

6,153,907

IC LAYOUT STRUCTURE FOR MOSFET HAVING NARROW AND SHORT CHANNEL

FIELD OF THE INVENTION

The present invention is related to an IC layout structure, and more particular to an IC layout structure designed for a MOSFET having a narrow and short channel in order to avoid the thinning of the field oxides beside the channel.

BACKGROUND OF THE INVENTION

In the field of semiconductor devices, a MOSFET is relatively essential and popular. For a MOSFET, it is desirable to miniaturize the device without sacrificing its operational properties. Changing the channel width and/or length of the MOSFET is one of the approaches to reduce the device size. Please refer to FIG. 1 which schematically shows a top-view shape of a conventional mask applied to a MOSFET having a narrow and short channel. In FIG. 1, the rectangular mask regions 11 and 12 define respective active regions, and the mask region 13 defines a region for forming therein a channel. Another region 14 schematically shows the distribution of a poly gate conductive layer. On the other hand, the remaining non-mask region is for forming field oxides for isolation. In the figure, the label L indicates the length of the channel, and the label W represents the width of the channel.

Now refer to FIG. 2 which is a cross-sectional view taken along the line X–X' of FIG. 1. For a mask shape and channel dimensions as shown in FIG. 1, the field oxide layers 21 and 22 formed beside the region 13 will have a cross-sectional shape as shown in FIG. 2. That is, portions 211 and 221 of the field oxide layers 21 and 22 beside the channel region 13 will become relatively thin due to a three dimensional oxidation thinning effect. The threshold voltage of the portions 211 and 221 of the field oxide layers 21 and 22 beside the channel region 13 will be accordingly reduced, and thus this isolation region is subject to the formation of an extensive channel so that the effective channel width is greater than the predetermined one. Therefore, the operational properties of the device will be somewhat different from the expected ones. It is particular obvious when the channel of the MOSFET is as narrow as less than 0.5 microns, and as short as less than 0.5 microns.

FIG. 3 is a saturate drain current per unit width vs. channel width plot of a MOSFET having a narrow and short channel and a layout as described above on the conditions of channel lengths of 25, 2, 1, 0.8, 0.6 and 0.45 microns, respectively, wherein four kinds of channel widths, i.e. 25, 3, 1 and 0.4 microns, are taken as measured points for each channel length. It is apparent from FIG. 3 that the drain current per $\mu$m width (IDsat/W in amp/$\mu$m) increases with the decrease of the channel width (W in $\mu$m), and the shorter the channel length, the more significant the effect of W on IDsat/W. In other words, owing to the 3-D oxidation thinning effect of the field isolation region beside the very short channel, which results from the rectangular shape of the mask on the active regions, an extensive channel is likely to be formed in the isolation region so that the effective channel width will be greater than the predetermined one, and the drain current will be varied beyond expectation. It will be a problem for the miniaturization of the device.

SUMMARY OF THE INVENTION

An object of the present invention is to provide an IC layout structure or a MOSFET having a narrow channel-width and a short channel-length, which may exempt the field oxide beside the channel from the 3-D oxidation thinning effect so as to stabilize the drain current.

The object of the present invention can be achieved by providing a specific IC layout structure for the MOSFET having a narrow and short channel, especially when the width and the length of the channel are both as small as 1 micron or less. In the IC layout structure, a mask includes a first mask region for defining a first active region, a second mask region for defining a second active region, and a third mask region for defining a channel region, and the third mask region is connected to the first and the second mask regions, respectively. According to the present invention, an angle at an joint between the first mask region and the third mask region and/or an angle at an joint between the second mask region and the third mask region are/is greater than 90 degrees, e.g. 135 degrees, so that there is more space beside the channel region provided for the growth of the field oxide and the 3-D oxidation thinning effect can be prevented.

In a preferred embodiment, the first and the second mask regions form areas of a funnel-like shape with the third mask region, respectively. The first and the second mask region have similar shapes but are upside down from each other relative to the third mask region.

In another embodiment, both of the first and the second mask regions are of a hexagonal shape consisted of a rectangle and a trapezoid which is directly connected to the third mask region, and are upside down from each other relative to the third mask region.

BRIEF DESCRIPTION OF THE DRAWING

The present invention may best be understood through the following description with reference to the accompanying drawings, in which.

DETAILED DESCRIPTION OF THE PREFERRED EMBODIMENT

The present invention will now be described more specifically with reference to the following embodiments. It is to be noted that the following descriptions of preferred embodiments of this invention are presented herein for purpose of illustration and description only; it is not intended to be exhaustive or to be limited to the precise form disclosed.

Figure 1:
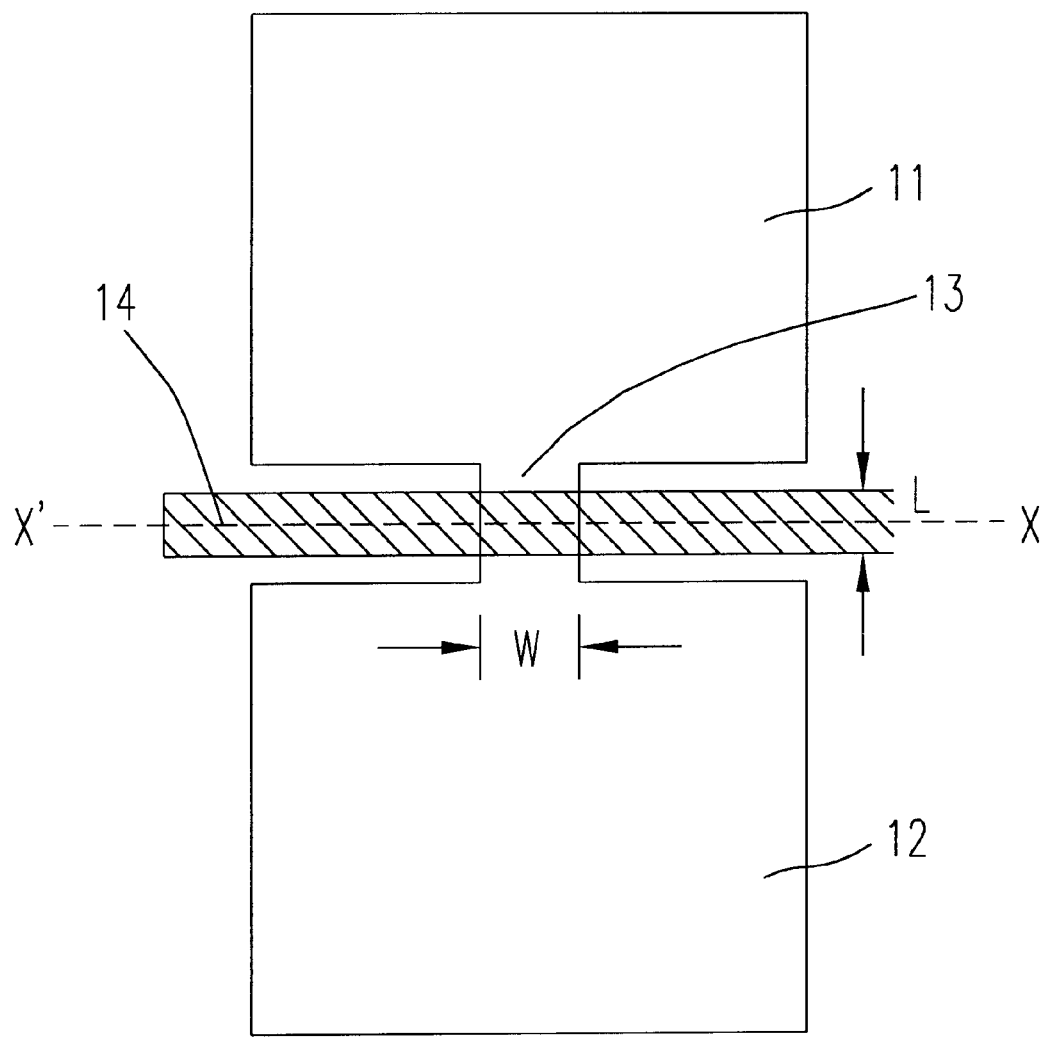
FIG. 1 is a top view of a conventional mask applied to a MOSFET having a narrow and short channel, which schematically shows a top-view shape of the mask.
Figure 2:
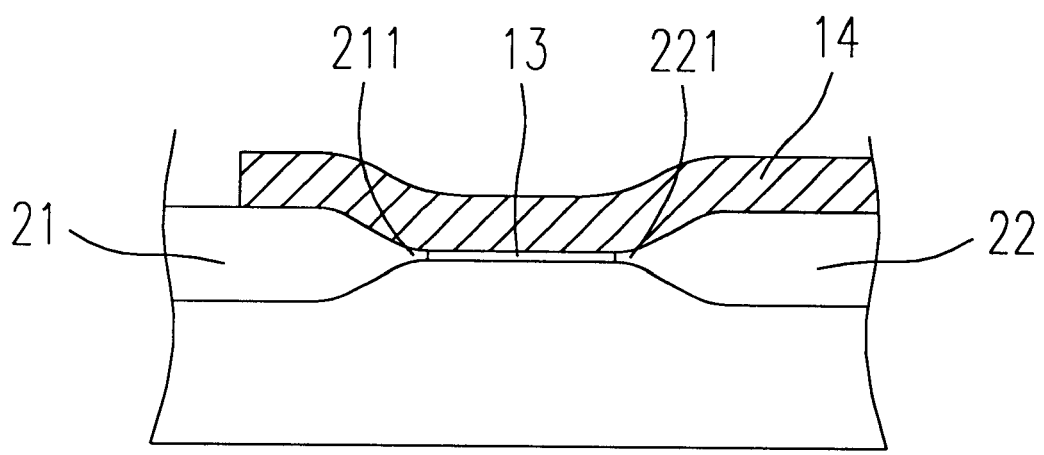
FIG. 2 is a cross-sectional view taken along the line X–X' of FIG. 1.
Figure 3:
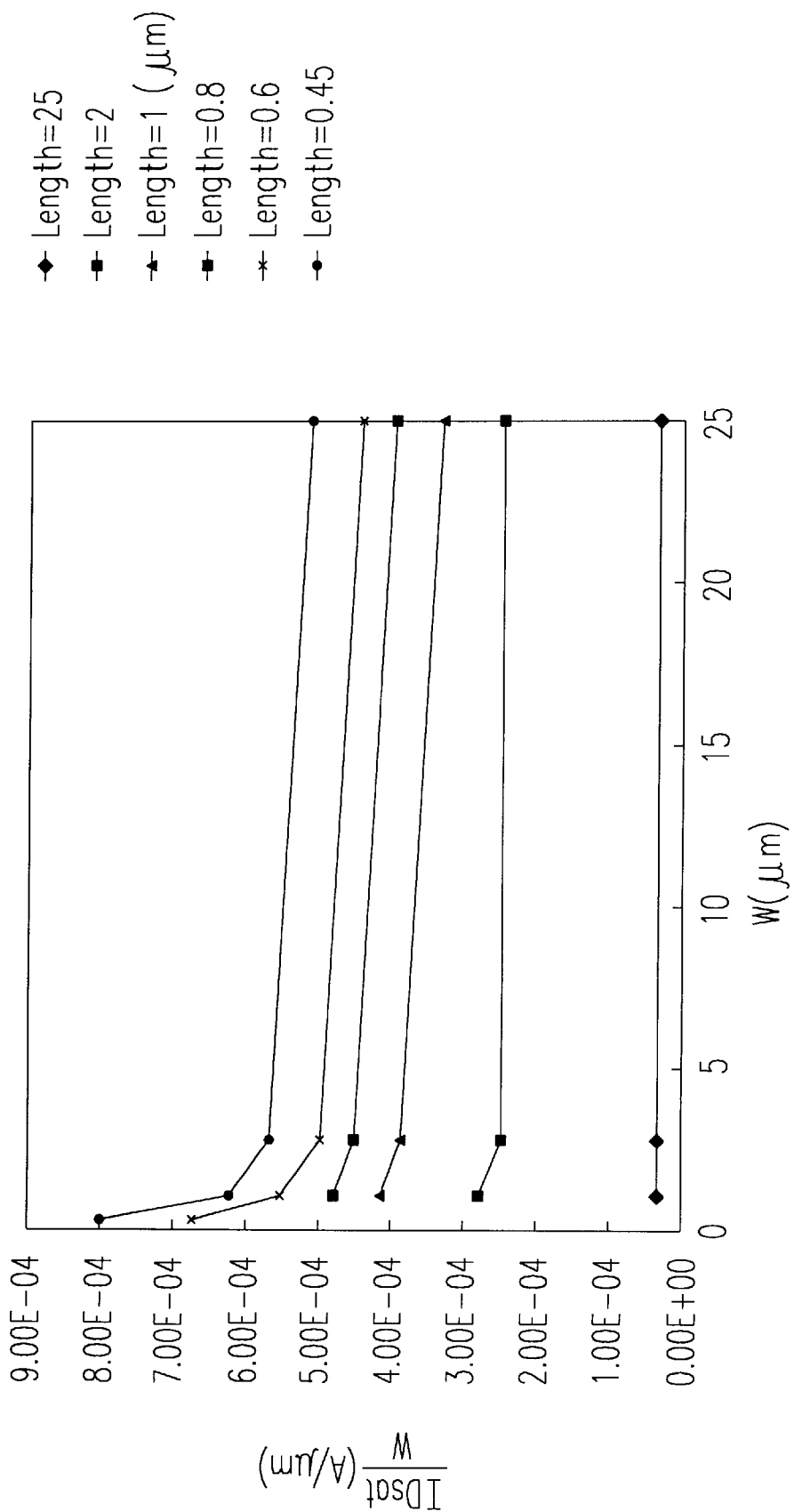
FIG. 3 is a saturate drain current per unit width vs. channel width plot of a MOSFET having a narrow and short channel and a mask shape of FIG. 1.
Figure 4:
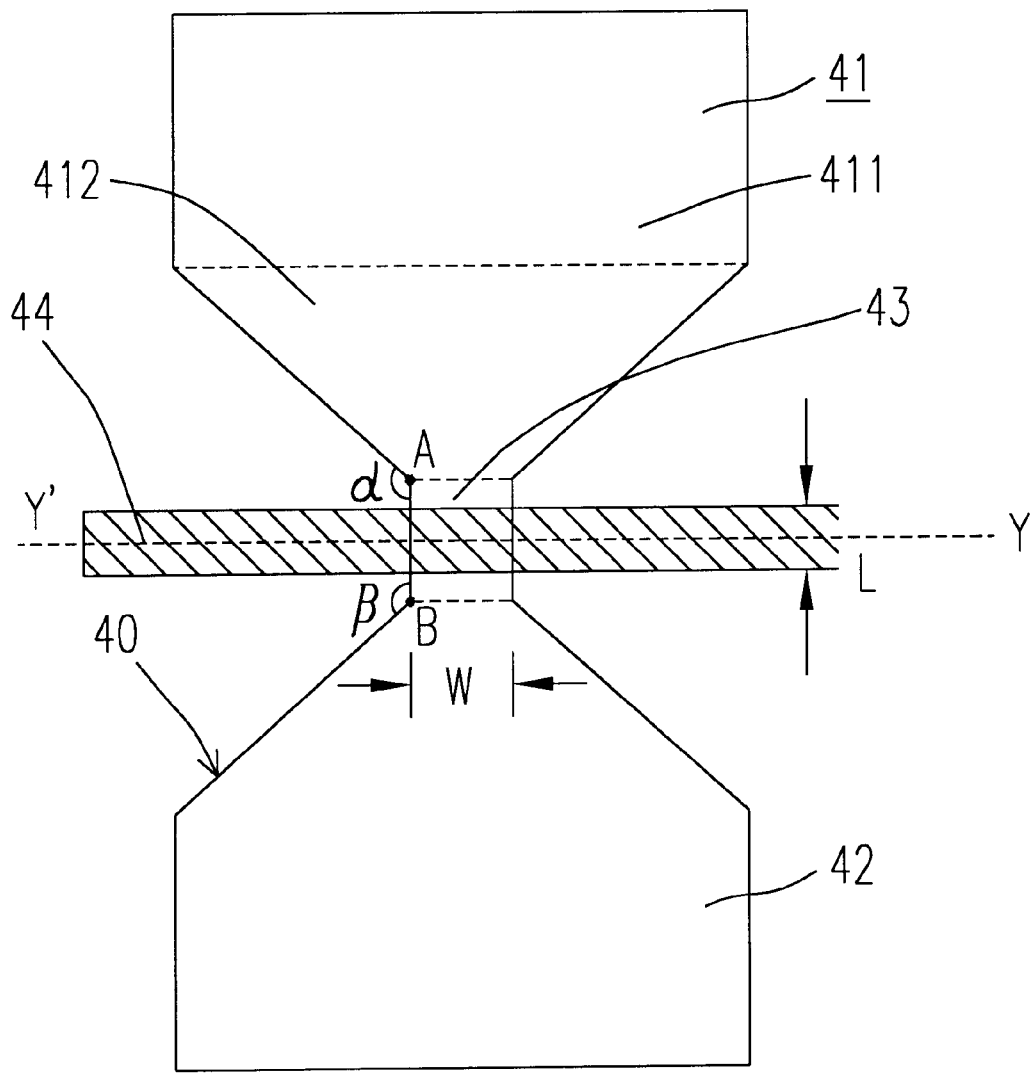
FIG. 4 is a top view of a preferred embodiment of an IC layout structure according to the present invention, in which a mask is applied to a MOSFET having a narrow and short channel, and a top-view shape of the mask is schematically shown.

Please refer to FIG. 4 which schematically shows a top-view shape of a mask applied to a MOSFET having a narrow and short channel according to the present invention. In the IC layout structure as shown in FIG. 4, a mask 40 includes a first mask region 41 and a second mask region 42 defining respective active regions, and a third mask region 43 defining a channel region. The third mask region 43 connects to the first and the second mask regions 41 and 42 respectively. Another region 44 shown in the figure schematically shows the distribution of a poly gate conductive layer. On the other hand, the remaining non-mask region is for forming field oxides for isolation. In this figure, the label L indicates the length of the channel, and the label W represents the width of the channel.

Figure 5:
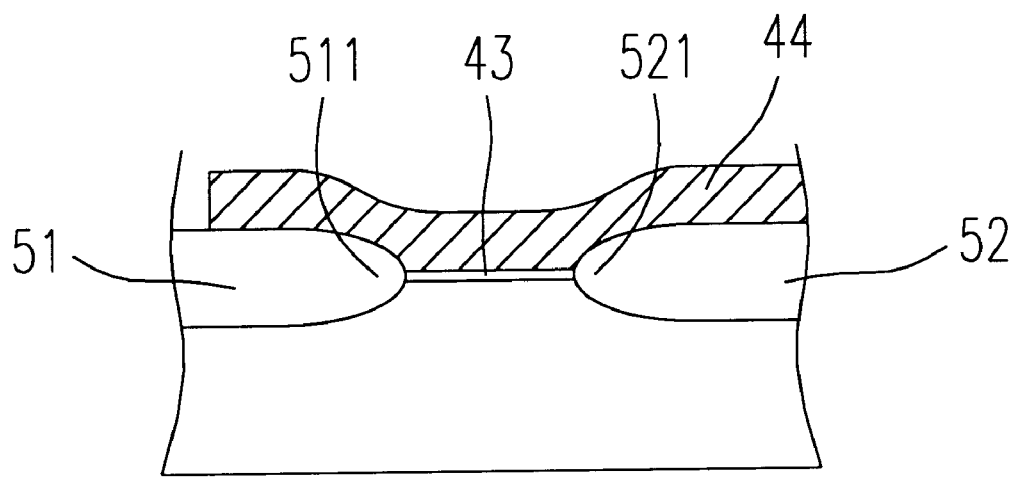
FIG. 5 is a cross-sectional view taken along the line Y–Y' of FIG. 4.

According to the present invention, with reference to FIG. 4, an angle a at an joint A between the first mask region 41 and the third mask region 43 is designed to be an obtuse angle, i.e. greater than 90 degrees, so that there will be more space beside the channel region 43 provided for the growth of the field isolation regions 51 and 52 (FIG. 5) to reduce the 3-D oxidation thinning effect. Preferably, an angle β at an joint β between the second mask region 42 and the third mask region 43 is also designed to be an obtuse angle to remain even more space for the field oxide. Accordingly, the portions 511 and 521 of the field isolation regions 51 and 52 immediately beside the channel region 43 will be rounded, and the thickness of the field isolation regions 51 and 52 will change relatively smoothly, as shown in FIG. 5. By this way, the formation of an extensive channel due to the lowering of the threshold voltage resulting from the 3-D oxidation thinning effect can be lessened or avoided. In other words, the effective channel width obtained according to the IC layout structure of the present invention approximates to the predetermined one, and the operational properties of the device can be performed as expected. The effect of the present invention is particular obvious when the channel of the MOSFET is as narrow as less than 1 $\mu$m, preferably less than 0.5 $\mu$m, and as short as less than 1 $\mu$m, preferably less than 0.5 $\mu$m.

It should be understood for those skilled in the art that the angles α and β as described above and the shapes of the mask regions can be varied as desired, as long as the purpose of the present invention for forming field oxide of adequate thickness can be achieved. For example, as shown in FIG. 4, the angles α and β is both set to be 135 degrees. The first and the third mask regions 41 and 43 can be combined to form an area of a funnel-like shape. Preferably, the second and the third mask regions 42 and 43 can also be combined to form an area of a funnel-like shape similar to but upside down from the area 41+43 relative to the third mask region 43.

Alternatively, it can also be seen from FIG. 4 that the shape of the first mask region 41 can be designed to have a hexagonal shape consisted of a rectangle 411 and a trapezoid 412 which is directly connected to the third mask region 43. In the embodiment shown in FIG. 4, the second mask region 42 has the same shape as the first mask region 41, but is upside down from the first mask region 41 relative to the third mask region 43.

While the invention has been described in terms of what are presently considered to be the most practical and preferred embodiments, it is to be understood that the invention need not be limited to the disclosed embodiment. On the contrary, it is intended to cover various modifications and similar arrangements included within the spirit and scope of the appended claims which are to be accorded with the broadest interpretation so as to encompass all such modifications and similar structures.

What is claimed is:

1. An IC layout structure for a MOSFET, in which a mask includes a first mask region for defining a first active region, a second mask region for defining a second active region, and a third mask region for defining a channel region, and said third mask region is connected to said first and said second mask regions, respectively, said IC layout structure being characterized in that an angle at an joint between said second mask region and said third mask region is greater than 90 degrees, and said second mask region is of a hexagonal shape consisted of a rectangle and a trapezoid which is directly connected to said third mask region.

2. The IC layout structure according to claim 1 wherein said first mask region is of a hexagonal shape upside down from said first mask region relative to said third mask region.

3. The IC layout structure according to claim 1 wherein said channel region has a width less than 1 micron and a length less than 1 micron.

4. An IC layout structure for a MOSFET, in which a mask includes a first mask region for defining a first active region, a second mask region for defining a second active region, and a third mask region for defining a channel region, said third mask region is connected to said first and said second mask regions, respectively, and said channel has a width less than 1 micron and a length less than 1 micron, said IC layout structure being characterized in that an angle at a joint between said first mask region and said third mask region, and an angle at a joint between said second mask region and said third mask region are both greater than 90 degrees, each of said first and second mask regions being of a hexagonal shape consisting of a rectangle and a trapezoid which is directly connected to said third mask region.

5. The IC layout structure according to claim 4 wherein said angles at said joints between said third mask region and said first and said second mask regions, respectively, are both about 135 degrees.

6. A method for preventing a field oxide formed beside a reduced size of channel region between active regions from 3-dimensional oxidation thinning effect, said method being conducted by providing an IC layout structure in which an angle at a joint between an active region mask and a channel region mask is greater than 90 degrees.

7. The method according to claim 6 wherein said angle is about 135 degrees.

8. The method according to claim 6 wherein said active region mask is of a hexagonal shape consisted of a rectangle and a trapezoid which is directly connected to said channel region mask.

9. The method according to claim 6 wherein said reduced size of channel region has a width less than 1 micron and a length less than 1 micron.

* * * * *